US010867852B2

(12) United States Patent
Yeh et al.

(10) Patent No.: US 10,867,852 B2
(45) Date of Patent: Dec. 15, 2020

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Chi-Ruei Yeh, New Taipei (TW); Wen-Hsin Chan, Hsinchu County (TW); Kang-Min Kuo, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 14/968,913

(22) Filed: Dec. 15, 2015

(65) Prior Publication Data

US 2017/0170067 A1 Jun. 15, 2017

(51) Int. Cl.
| H01L 21/76 | (2006.01) |
| H01L 21/768 | (2006.01) |
| H01L 29/66 | (2006.01) |
| H01L 21/306 | (2006.01) |
| H01L 21/308 | (2006.01) |
| H01L 23/535 | (2006.01) |
| H01L 29/423 | (2006.01) |
| H01L 29/78 | (2006.01) |

(52) U.S. Cl.
CPC .... *H01L 21/76897* (2013.01); *H01L 21/3085* (2013.01); *H01L 21/30604* (2013.01); *H01L 21/30625* (2013.01); *H01L 21/76832* (2013.01); *H01L 21/76834* (2013.01); *H01L 23/535* (2013.01); *H01L 29/42356* (2013.01); *H01L 29/66545* (2013.01); *H01L 29/78* (2013.01)

(58) Field of Classification Search
None
See application file for complete search history.

(56) References Cited

U.S. PATENT DOCUMENTS

| 8,436,404 B2 * | 5/2013 | Bohr | H01L 21/76831 257/288 |
| 8,728,927 B1 * | 5/2014 | Cheng | H01L 21/486 257/E21.658 |
| 8,836,038 B2 * | 9/2014 | Hou | H01L 21/823835 257/288 |
| 9,853,110 B2 * | 12/2017 | Zhang | H01L 29/41791 |
| 2005/0179085 A1 * | 8/2005 | Yamauchi | H01L 29/402 257/344 |
| 2006/0267106 A1 * | 11/2006 | Chao | H01L 21/823807 257/382 |
| 2009/0101992 A1 * | 4/2009 | Change | H01L 21/76897 257/401 |
| 2012/0034773 A1 * | 2/2012 | Ott | H01L 21/2807 438/592 |

(Continued)

*Primary Examiner* — Abul Kalam
(74) *Attorney, Agent, or Firm* — JCIPRNET

(57) ABSTRACT

Provided is a semiconductor device including a substrate, a gate structure, a dielectric layer, an etch stop layer, and an adhesion layer. The gate structure is formed over the substrate. The dielectric layer is formed aside the gate structure. The adhesion layer overlays a top surface of the gate structure and extends to a first top surface of the dielectric layer. The etch stop layer is over the adhesion layer and in contact with a second top surface of the dielectric layer.

20 Claims, 6 Drawing Sheets

(56) References Cited

U.S. PATENT DOCUMENTS

| | | | |
|---|---|---|---|
| 2013/0328115 A1* | 12/2013 | Chuang | H01L 21/823842 257/288 |
| 2014/0361364 A1* | 12/2014 | Chen | H01L 29/408 257/336 |
| 2015/0021672 A1* | 1/2015 | Chuang | H01L 21/28088 257/288 |
| 2015/0021683 A1* | 1/2015 | Xie | H01L 29/6653 257/330 |
| 2015/0137273 A1* | 5/2015 | Zhang | H01L 29/66545 257/412 |
| 2015/0364378 A1* | 12/2015 | Xie | H01L 21/823437 257/368 |
| 2016/0043186 A1* | 2/2016 | Liu | H01L 29/6656 257/401 |
| 2016/0133623 A1* | 5/2016 | Xie | H01L 27/088 257/384 |
| 2016/0133721 A1* | 5/2016 | Cai | H01L 29/4958 257/506 |
| 2016/0225630 A1* | 8/2016 | Hsiao | H01L 21/3065 |
| 2016/0293721 A1* | 10/2016 | Chuang | H01L 21/28088 |

\* cited by examiner

SEMICONDUCTOR DEVICE AND MANUFACTURING METHOD THEREOF

BACKGROUND

The semiconductor integrated circuit (IC) industry has experienced rapid growth. Over the course of this growth, functional density of the devices has generally increased by the device feature size.

This scaling down process generally provides benefits by increasing production efficiency, lower costs, and/or improving performance. Such scaling down has also increased the complexities of processing and manufacturing ICs and, for these advances to be realized similar developments in IC fabrication are needed.

As technology nodes shrink, in some IC designs, the typical polysilicon gate electrode is replaced with a metal gate electrode to improve device performance with the decreased feature sizes. However, there are still quite a few challenges to be handled for the technology of the metal gate electrode.

DETAILED DESCRIPTION

Figure 1:
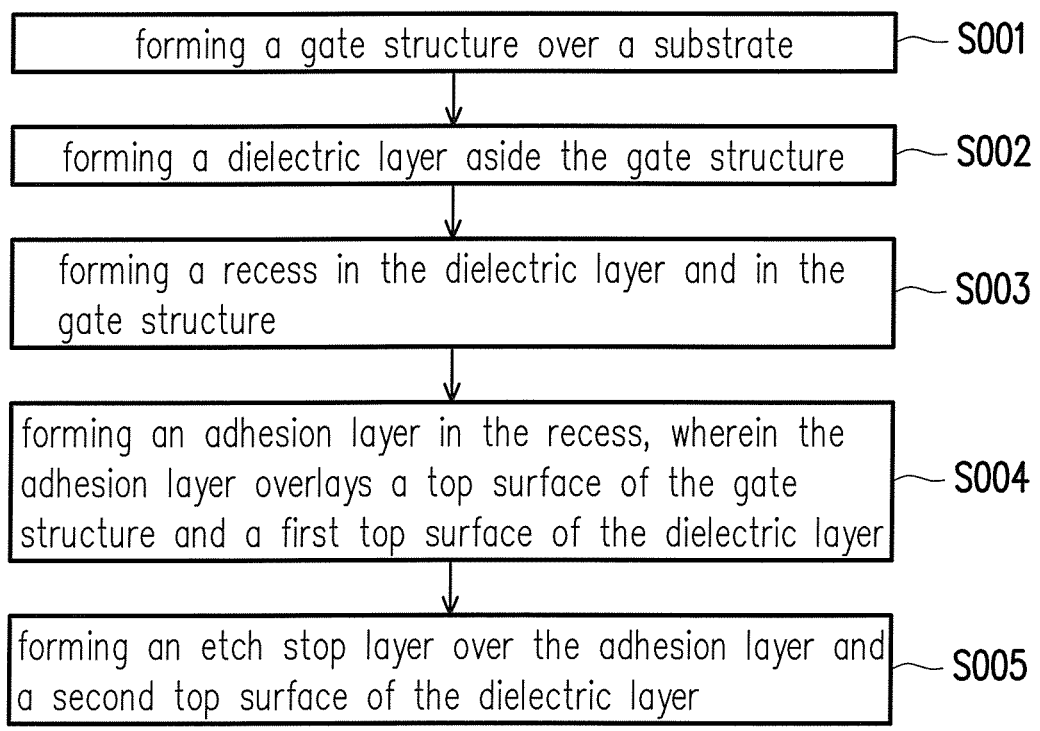
FIG. 1 is a flowchart illustrating a manufacturing method of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart illustrating a manufacturing method of a semiconductor device according to some embodiments of the disclosure. FIG. 2A through FIG. 2G are schematic cross-sectional views illustrating a manufacturing method of a semiconductor device in accordance with a first embodiment of the disclosure.

Figure 2A:
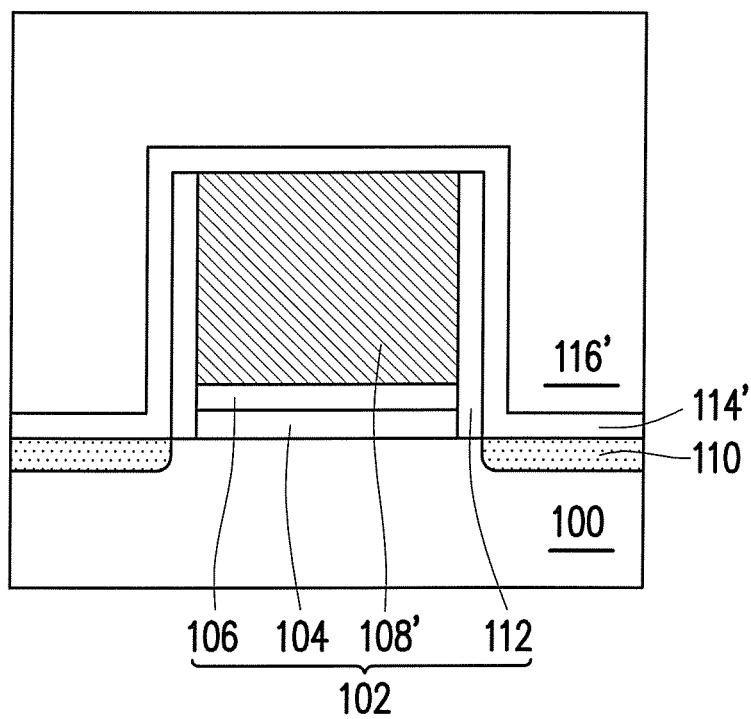
FIG. 2A through FIG. 2G are schematic cross-sectional views illustrating a manufacturing method of a semiconductor device in accordance with a first embodiment of the disclosure.

Referring to FIG. 1 and FIG. 2A simultaneously, in step S001, a substrate 100 is provided. In some embodiments, the substrate 100 is made of silicon or other semiconductor materials. Alternatively or additionally, substrate 100 includes other elementary semiconductor materials such as germanium, gallium arsenic, or other suitable semiconductor materials. In some embodiments, substrate 100 may further include other features such as various doped regions, a buried layer, and/or an epitaxy layer. Moreover, in some embodiments, substrate 100 is made of an alloy semiconductor such as silicon germanium, silicon germanium carbide, gallium arsenic phosphide, or gallium indium phosphide. Furthermore, the substrate 100 may be a semiconductor on insulator such as silicon on insulator (SOI) or silicon on sapphire.

Then, a gate structure 102 is formed over the substrate 100. In some embodiments, the gate structure 102 includes a gate dielectric layer 106 and a gate electrode 108' in sequential order from bottom to top. In alternative embodiments, the gate structure 102 may further include an interfacial layer (IL) 104 between the substrate 100 and the gate electrode 108'. In other words, the gate dielectric layer 106 is formed between the IL 104 and the gate electrode 108'. In some embodiments, the IL 104 includes a dielectric material, such as a silicon oxide layer or a silicon oxynitride layer. The IL 104 is formed by a thermal oxidation process, a chemical vapor deposition (CVD) process, or an atomic layer deposition (ALD) process.

In some embodiments, the gate dielectric layer 106 includes silicon oxide, silicon nitride, silicon oxy-nitride, high-k dielectric materials, or a combination thereof. The high-k dielectric materials are generally dielectric materials with a dielectric constant greater than 4. The high-k dielectric materials include metal oxide. In some embodiments, examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layer 106 is formed by a thermal oxidation process, a CVD process, or an ALD process.

In some embodiments, the gate electrode 108' is a dummy gate. The dummy gate includes a polysilicon layer formed by a CVD process, for example. In alternative embodiments, the gate electrode 108' is a metal gate, and the gate electrode 108' includes a barrier, a work function layer, a seed layer, an adhesion layer, a barrier layer, or a combination thereof. In some embodiments, the gate electrode 108' includes suitable metals, such as TiN, WN, TaN, or Ru for a PMOS device. In some alternative embodiments, the gate electrode 108 includes suitable metals, such as Ti, Ag, Al, TiAl, TiAlN, TaC, TaCN, TaSiN, Mn, or Zr for an NMOS device.

In addition, the gate structure 102 further includes a spacer 112 formed over the sidewalls of the gate structure 102. In some embodiments, the spacer 112 is formed of silicon oxide, silicon nitride, silicon oxynitride, silicon carbide, fluoride-doped silicate glass (FSG), low k dielectric materials, or a combination thereof. The spacer 112 has a multi-layer structure which includes one or more liner layers. The liner layer includes a dielectric material such as silicon oxide, silicon nitride, and/or other suitable materials. The formation of the spacer 112 can be achieved by depositing suitable dielectric material and anisotropically etching off the dielectric material.

Referring to FIG. 2A, a source and drain (S/D) regions 110 is formed in the substrate 100 to provide a low resistance contact. The doped region is achieved via ion implantation of boron or phosphorous. Alternatively, in some other embodiments, part of the substrate 100 is removed through etching or other suitable processes and the dopants are formed in the hollowed area through epitaxy growth. Specifically, the epitaxial layers include SiGe, SiC, or other suitable materials. It is understood that the semiconductor device may be formed by CMOS technology processing, and thus some processes are not described in detail herein.

In some embodiments, silicide regions (not shown) may be optionally formed on the S/D regions 110 by a self-aligned silicide (salicide) process. The silicide regions include titanium silicide, cobalt silicide, nickel silicide, platinum silicide, erbium silicide, or palladium silicide. In some embodiments, germanide regions may be optionally formed on the S/D regions 110 by a self-aligned germanide process if the substrate 100 includes Ge. In some embodiments, the germanide regions include NiGe, PtGe, TiGe$_2$, CoGe$_2$, or PdGe.

Referring to FIG. 2A, an etch stop layer 114' is formed over the gate structure 102 and the substrate 100. In some embodiments, the etch stop layer 114' is conformally formed to overlay sidewalls and the top surface of the gate structure 102 and the S/D regions 110. In some embodiment, the etch stop layer 114' is a contact etch stop layer (CESL). The etch stop layer 114' includes silicon nitride or carbon-doped silicon nitride, for example. In some embodiments, the etch stop layer 114' is deposited using CVD, HDPCVD, SACVD, molecular layer deposition (MLD), or other suitable methods. In some embodiments, before the etch stop layer 114 is formed, a buffer layer (not shown) may be further formed over the substrate 100. In an embodiment, the buffer layer is an oxide such as silicon oxide. However, other compositions may be possible. In some embodiments, the buffer layer is deposited using CVD, HDPCVD, SACVD, MLD, or other suitable methods.

Referring to FIG. 1 and FIG. 2A simultaneously, in step S002, a dielectric layer 116' is formed over the etch stop layer 114' and aside the gate structure 102. The dielectric layer 116' includes a dielectric material. The dielectric material includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 116' includes low-k dielectric materials. It should be noted that the low-k dielectric materials are generally dielectric materials having a dielectric constant lower than 3.9. Examples of low-k dielectric materials includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 116' may include one or more dielectric materials and/or one or more dielectric layers. In some embodiments, the dielectric layer 116 is deposited to a suitable thickness by CVD, HDPCVD, SACVD, spin-on, or other suitable methods.

Figure 2B:
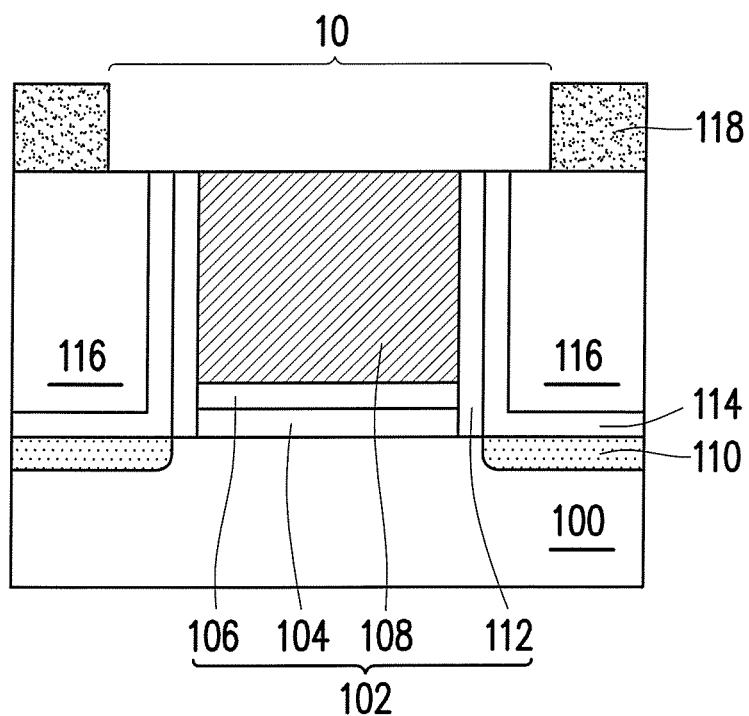

Referring to FIG. 2B, a portion of the dielectric layer 116' and a portion of the etch stop layer 114' are removed such that a top surface of the gate structure 102 is exposed, and a dielectric layer 116 and an etch stop layer 114 are remained. The process of removing the portion of the dielectric layer 116' and the portion of the etch stop layer 114' is achieved by a chemical mechanical polishing (CMP) process, an etching process, or other suitable process.

Referring to FIG. 2B, in some embodiments, when the gate electrode 108' is a dummy gate, a gate replacement process is performed. In the gate replacement process, the gate electrode 108' is removed to form a gate trench, and then a gate electrode 108 is filled into the gate trench. The gate electrode 108 may include a barrier, a work function layer, a seed layer, an adhesion layer, a barrier layer, or a combination thereof. In some embodiments, the gate electrode 108 includes suitable metals, such as TiN, WN, TaN, or Ru for a PMOS device. In some alternative embodiments, the gate electrode 108 includes suitable metals, such as Ti, Ag, Al, TiAl, TiAlN, TaC, TaCN, TaSiN, Mn, or Zr for an NMOS device.

Referring to FIG. 2B, a patterned mask layer 118 is formed over the dielectric layer 116. The patterned mask layer 118 has an opening 10 which exposes a portion of a top surface of the dielectric layer 116, a top surface of the gate structure 102 and a top surface of the etch stop layer 114. The patterned mask layer 118 is formed using processes such as spin-coating a mask material layer, performing a photolithography processes to the mask material layer and/or other processes. Specifically, the photolithography processes includes exposure, bake, and development. The mask material layer is sensitive to a specific exposure beam such as KrF, ArF, EUV or e-beam light. In some embodiments, the mask material layer may include polymers, quencher, chromophore, solvent and/or chemical amplifier (CA).

Figure 2C:
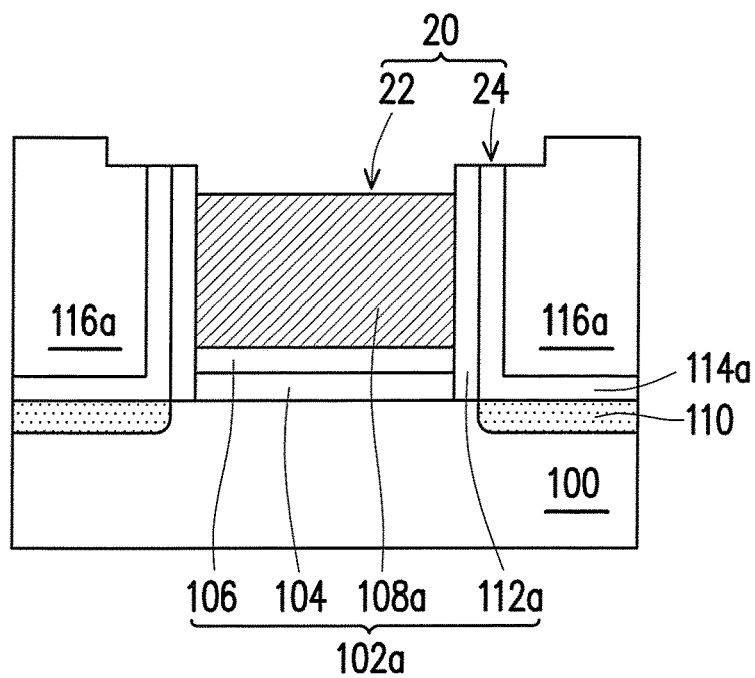

Referring to FIG. 1, FIG. 2B and FIG. 2C simultaneously, in step S003, an etching process is performed to remove a portion of the dielectric layer 116, a portion of the etch stop layer 114 and a portion of the gate structure 102, so as to form a recess 20 in a dielectric layer 116a, an etch stop layer 114a and the gate structure 102. The recess 20 includes a recess 22 over the gate electrode 108 and a recess 24 over the etch stop layer 114a and the dielectric layer 116a. In some embodiments, when the removing rate of the portion of the dielectric layer 116 is not equal to the removing rate of the portion of the gate structure 102, a surface of the dielectric layer 116a exposed by the recess 20 has a step shape. For example, a top surface of the spacers 112a is higher than a top surface of the gate electrode 108a, as illustrated in FIG. 2C. The patterned mask layer 118 is removed after the etching process is completed. The patterned mask layer 118 is removed through a dry stripping process, a wet stripping process, or other suitable processes.

Figure 2D:
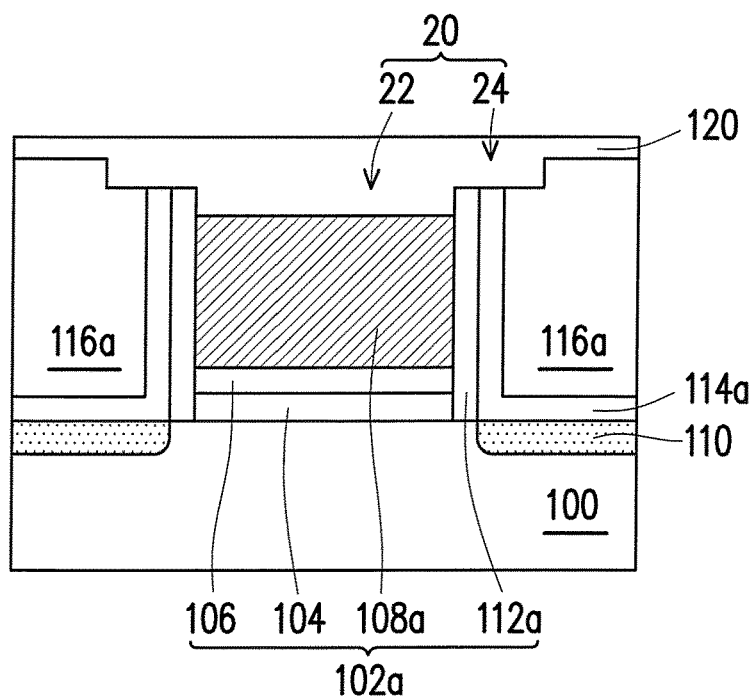
Figure 2E:
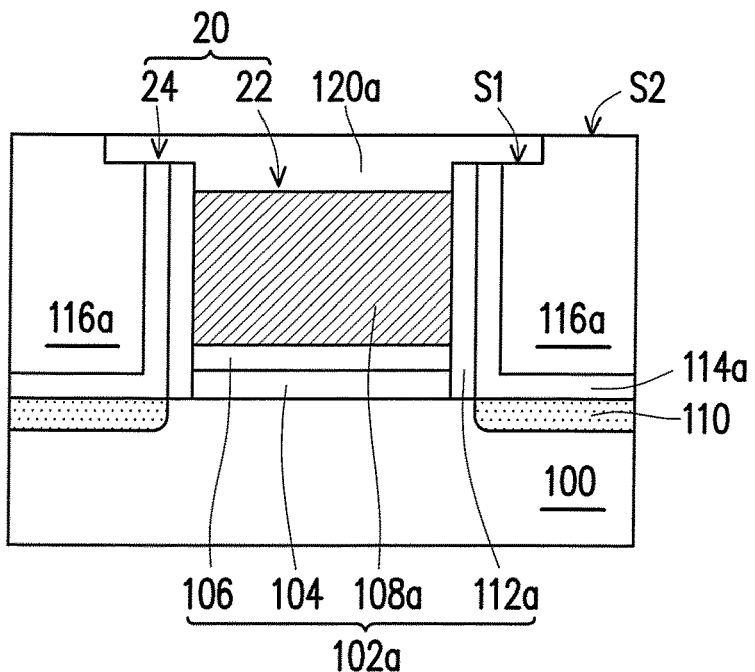

Referring to FIG. 1, FIG. 2D and FIG. 2E simultaneously, in step S004, after the patterned mask layer 118 is removed, an adhesion material layer 120 is filled in the recess 20 to overlay the dielectric layer 116a, the etch stop layer 114a, and the gate structure 102a. In some embodiments, a material of the adhesion material layer 120 is a high-k dielectric material. A high-k dielectric material is generally a dielectric material with a dielectric constant greater than 4. In some embodiments, high-k dielectric material has a dielectric constant greater than silicon nitride. The high-k dielectric material includes a nitrogen-containing material, a metal nitride material, a metal oxide material, or a combination thereof. The nitrogen-containing material includes SiCN, SiOCN, or a combination thereof. The metal nitride material includes AlN, TiN, TaN or a combination thereof. Examples of metal oxides include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. In some alternatively embodiments, the material of the adhesion material layer 120 may be metal material including Al, Ti, Ta, W, or a combination thereof. In some embodiments, a material of the adhesion material layer 120 is different from a material of the dielectric layer 116, a material of the gate electrode 108a and a material of the etch stop layer 122 formed subsequently. The present disclosure is not intended to limit the material of the adhesion material layer 120 and other material not listed may be adapted as long as the adhesion between the adhesion material layer 120 and the gate electrode 108a is better than the adhesion between the gate electrode 108a and the etch stop layer 122 formed subsequently. On the other hand, as long as the adhesion between the adhesion material layer 120 and the etch stop layer 122 formed subsequently is better than the adhesion between the gate electrode 108a and the etch stop layer 122 formed subsequently, the present disclosure does not limit the material of the adhesion material layer 120.

Referring to FIG. 2E, a portion of the adhesion material layer 120 is removed, so as to expose a second top surface S2 of the dielectric layer 116a. In other words, the adhesion layer 120a is filled into the recess 22 and the recess 24. More specifically, the adhesion layer 120a overlays the top surfaces of the gate structure 102a and the etch stop layer 114a and extends to a first top surface S1 of the dielectric layer 116a. In some embodiments, the top surface of the adhesion layer 120a is coplanar with the second top surface S2 of the dielectric layer 116a. A method of removing the portion of the adhesion material layer 120 may include a chemical mechanical polishing (CMP) process, an etching back process, or a combination thereof, for example.

Figure 2F:
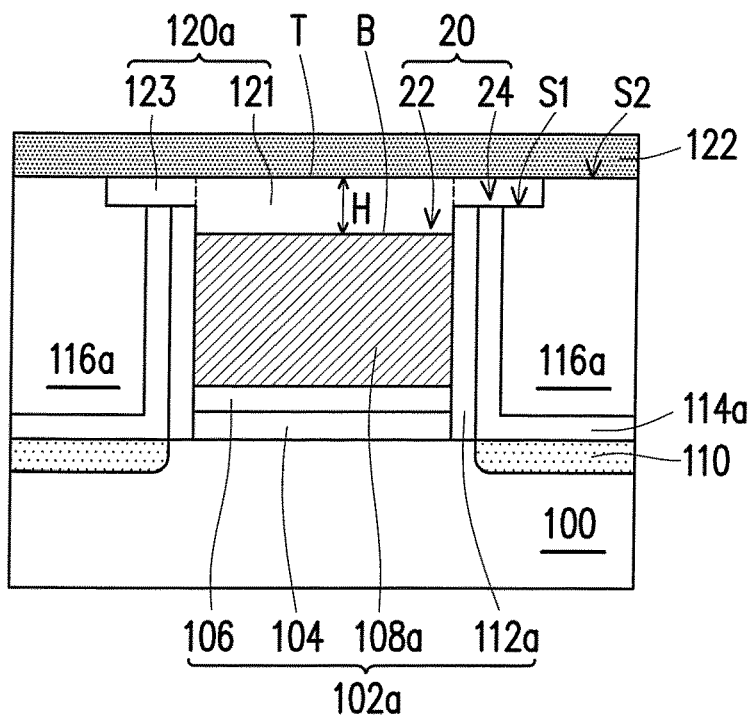

Referring to FIG. 1 and FIG. 2F simultaneously, in step S005, an etch stop layer 122 is formed over the adhesion layer 120a and the dielectric layer 116a. The etch stop layer 122 is able to protect the gate structure 102a during contact hole etching process. The etch stop layer 122 includes silicon nitride, silicon oxynitride, silicon carbide, carbon-doped silicon nitride, or a combination thereof, for example. The etch stop layer 122 may have any suitable thickness, as long as the thickness of the etch stop layer 122 is sufficient to protect the gate structure 102a from being damaged during contact hole etching process. In some embodiments, the etch stop layer 122 may be deposited using CVD, HDPCVD, SACVD, molecular layer deposition (MLD), or other suitable methods.

In some embodiments, the etch stop layers 114a, 122 include the same material. In some alternative embodiments, the etch stop layers 114a, 122 may include different materials. For example, in certain embodiments, the etch stop layers 114a is silicon nitride, the etch stop layer 122 is carbon-doped silicon nitride, and vice versa.

Figure 2G:
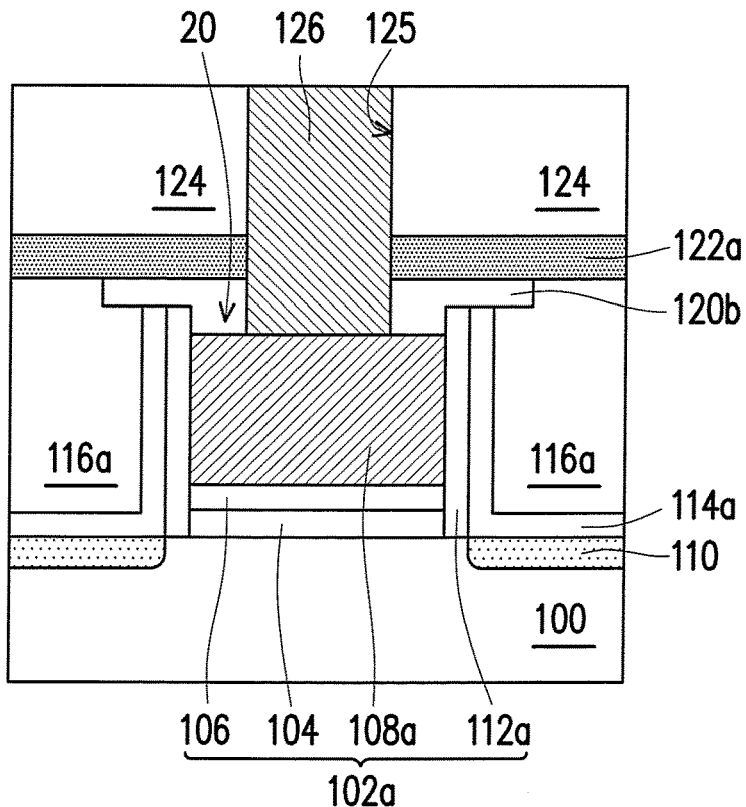

Referring to FIG. 2G, a dielectric layer 124 is formed over the etch stop layer 122. A contact hole 125 is formed in the dielectric layer 124, an etch stop layer 122a and an adhesion layer 120b. In some embodiment, the contact hole 125 is formed by a photolithography process and an etching process. In some embodiments, the dielectric layer 124, 116a may include the same material and the same formation method, but the present disclosure is not limited thereto. In other embodiments, the etch stop layers 122a, 114a may include different materials and formation methods. The material and the formation method have been described in the foregoing paragraphs, and the details are not iterated herein.

Afterwards, a conductive material (not shown) may be formed to fill in the contact hole 125, so as to form a contact 126. The contact 126 is formed over the gate structure 102a and penetrates the dielectric layer 124, the etch stop layer 122a and the adhesion layer 120b to electrically connect with the gate electrode 108a. The conductive material may include metal material or alloy, for example. In some embodiments, the metal material includes copper, copper alloys, aluminum, aluminum alloys, tungsten, or a combination thereof. In other embodiments, the contact 126 may include liner layers, seed layers, adhesion layers, barrier layers, etc. Then, a portion of the conductive material is removed to expose a top surface of the dielectric layer 124. In some embodiments, a top surface of the contact 126 is coplanar with the top surface of the dielectric layer 124.

Referring back to FIG. 2F, the semiconductor device of the first embodiment includes the substrate 100, the gate structure 102a, the dielectric layer 116a, the etch stop layer 122, and the adhesion layer 120a. The semiconductor device of the first embodiment further includes the dielectric layer 124 and the contact 126 (shown in FIG. 2G). The gate structure 102a is formed over the substrate 100. The dielectric layer 116a is formed aside the gate structure 102a. The adhesion layer 120a is filled in a recess 20 formed by the etch stop layer 122, the gate structure 102a, and the dielectric layer 116a. In other words, the adhesion layer 120a overlays the top surface of the gate structure 102a and is filled into a recess 24 of the dielectric layer 116a. More specifically, a height difference H exists between the top surface of the gate structure 102a and the bottom surface of the etch stop layer 122. In some embodiments, the height difference H refers to a thickness of the adhesion layer 120a, and the height difference H is in a range of 50 Å to 500 Å. The etch stop layer 122 overlays the adhesion layer 120a and in contact with the second top surface S2 of the dielectric layer 116a.

On the other hand, the adhesion layer 120a includes a main part 121 and an extension part 123 connected to the main part 121. As shown in FIG. 2F, the extension part 123 is filled into the recess 20b of the dielectric layer 116a. A profile of an interface between the adhesion layer 120a and the dielectric layer 116a may be a step shape, for example. In some embodiments, a top surface area T of the adhesion layer 120a is larger than a bottom surface area B of the adhesion layer 120a.

Referring back to FIG. 2F, it is noted that a better adhesion between the gate structure 102a and the etch stop layer 122 can be achieved, so as to prevent issues such as delamination or peeling of the etch stop layer 122. In addition, the adhesion layer 120a not only overlays the top surface of the gate structure 102a, but also overlays the first top surface S1 of the dielectric layer 116a. Thus, the adhesion layer 120a of the present disclosure is able to protect the interface between the gate structure 102a and the dielectric layer 116a from an attacked path provided by the following wet chemical cleaning process, which would possibly result in loss of the gate structure 102a. Moreover, since the adhesion layer 120a overlays the first top surface S1 of the dielectric layer 116a, and a second top surface of the dielectric layer is in contact with the etch stop layer, the present disclosure is able to enhance adhesion while decreasing RC delay of the semiconductor device.

Figure 3:
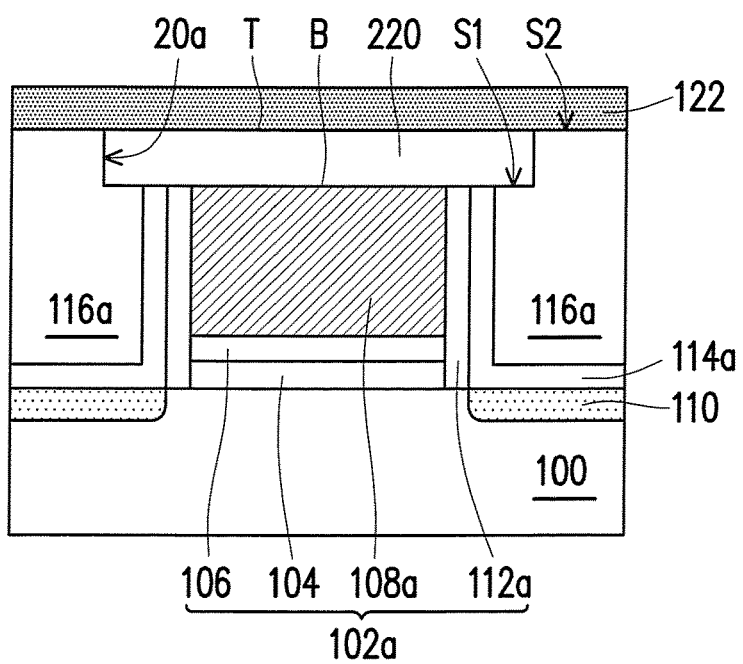
FIG. 3 is a cross-sectional view of a semiconductor device in accordance with a second embodiment of the disclosure.

FIG. 3 is a cross-sectional view of a semiconductor device in accordance with a second embodiment of the disclosure.

In the following embodiments, similar reference numerals indicate similar components, thus, the materials and formation methods of these components are not iterated herein.

The semiconductor device of the second embodiment illustrated in FIG. 3 is similar to the semiconductor device of the first embodiment shown in FIG. 2F. The difference between the first embodiment and the second embodiment lies in that an adhesion layer 220 of the second embodiment has a rectangular shape and a profile of the interface between the adhesion layer 220 and the dielectric layer 116a is a step shape. In the viewpoint of the manufacturing method, when a removing rate of the portion of the dielectric layer 116 is equal to a removing rate of the portion of the gate structure 102, a recess 20a formed therein is a rectangular shape, and thus the adhesion layer 220 has the rectangular shape (as shown in FIG. 3). In some embodiments, a top surface area T of the adhesion layer 220 is equal to a bottom surface area B of the adhesion layer 220.

Figure 4:
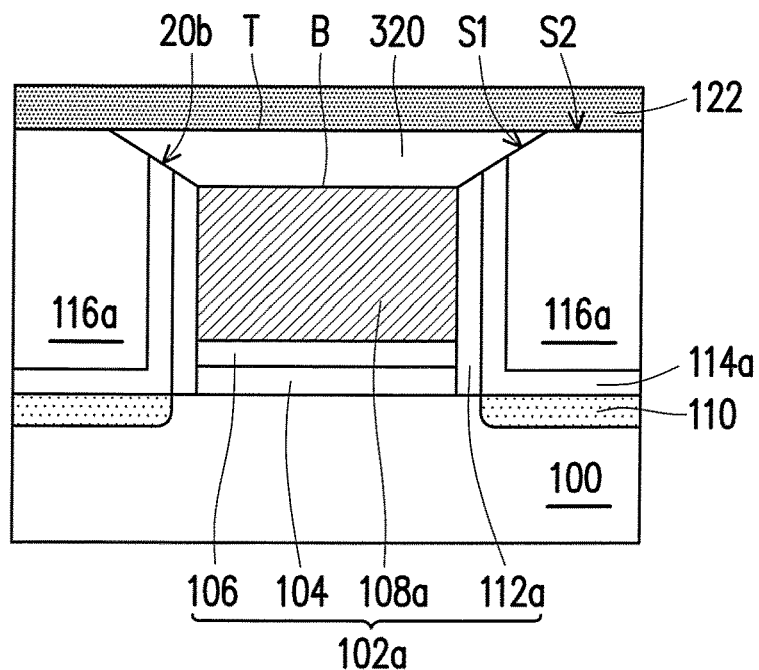
FIG. 4 is a cross-sectional view of a semiconductor device in accordance with a third embodiment of the disclosure.

FIG. 4 is a cross-sectional view of a semiconductor device in accordance with a third embodiment of the disclosure.

The semiconductor device of the third embodiment illustrated in FIG. 4 is similar to the semiconductor device of the first embodiment shown in FIG. 2F. A difference between the first embodiment and the third embodiment lies in that an adhesion layer 320 of the third embodiment has an inverted trapezoidal shape and a profile of the interface between the adhesion layer 320 and the dielectric layer 116a is a slope shape, for example. In the viewpoint of the manufacturing method, when the removing rate of the portion of the dielectric layer 116 is not equal to the removing rate of the portion of the gate structure 102, a recess 20b formed therein has an inverted trapezoidal shape (as shown in FIG. 4), and thus the adhesion layer 320 has the inverted trapezoidal shape. In some embodiments, a top surface area T of the adhesion layer 320 is larger than a bottom surface area B of the adhesion layer 320.

Figure 5:
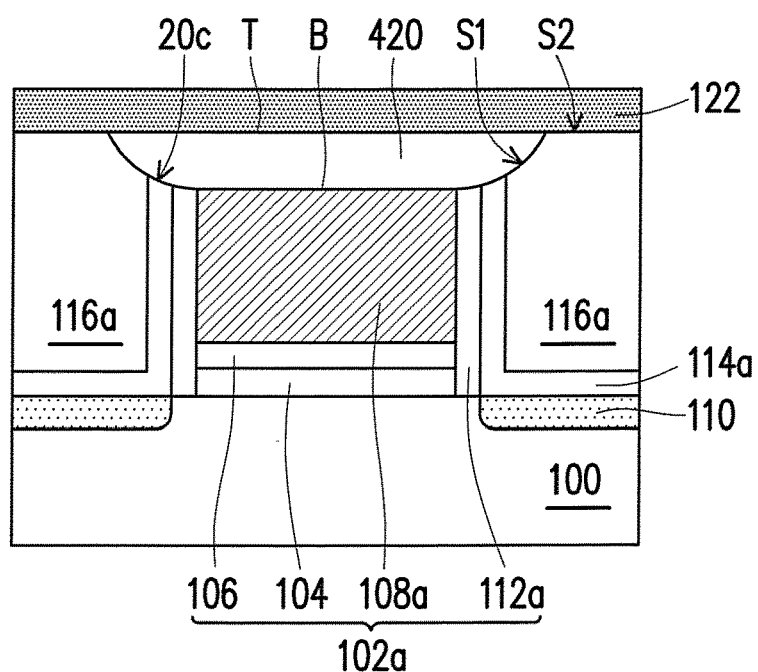
FIG. 5 is a cross-sectional view of a semiconductor device in accordance with a fourth embodiment of the disclosure.

FIG. 5 is a cross-sectional view of a semiconductor device in accordance with a fourth embodiment of the disclosure.

The semiconductor device of the fourth embodiment illustrated in FIG. 5 is similar to the semiconductor device of the first embodiment shown in FIG. 2F. A difference between the first embodiment and the fourth embodiment lies in that the shape of an adhesion layer 420 of the fourth embodiment has a bowl-shape and a profile of the interface between the adhesion layer 420 and the dielectric layer 116a is an arc shape, for example. In the viewpoint of the manufacturing method, when the removing rate of the portion of the dielectric layer 116 is not equal to the removing rate of the portion of the gate structure 102, a recess 20c formed therein has a bowl-shape, and thus the adhesion layer 420 has the bowl-shape (as shown in FIG. 5). In some embodiments, a top surface area T of the adhesion layer 420 is larger than a bottom surface area B of the adhesion layer 420.

The present disclosure is not limited to applications in which the semiconductor device includes a MOS transistor, and may be extended to other integrated circuit having a dynamic random access memory (DRAM) cell, a single electron transistor (SET), and/or other microelectronic devices (collectively referenced to herein as microelectronic devices). In another embodiment, the semiconductor device may include FinFET transistors, for example.

In the embodiments of the disclosure, since an adhesion layer overlays a top surface of the gate structure and extends to a first top surface of the dielectric layer, a better adhesion between the gate structure and the etch stop layer can be achieved, so as to prevent issues such as delamination or peeling of the etch stop layer. In addition, the adhesion layer of the present disclosure is able to protect the interface between the gate structure and the dielectric layer from an attacked path provided by the following wet chemical cleaning process, which would possibly result in loss of the gate structure. Moreover, since the adhesion layer overlays the first top surface of the dielectric layer, and a second top surface of the dielectric layer is in contact with the etch stop layer, the present disclosure is able to enhance adhesion while decreasing RC delay of the semiconductor device.

In accordance with some embodiments of the present disclosure, a semiconductor device includes a substrate, a gate structure, a dielectric layer, an etch stop layer, and an adhesion layer. The gate structure is formed over the substrate. The dielectric layer is formed aside the gate structure. The adhesion layer overlays a top surface of the gate structure and extends to a first top surface of the dielectric layer. The etch stop layer is formed over the adhesion layer and in contact with a second top surface of the dielectric layer.

In accordance with yet alternative embodiments of the present disclosure, a semiconductor device includes a gate structure, a dielectric layer, an etch stop layer, and an adhesion layer. The gate structure is formed over a substrate. The dielectric layer is formed aside the gate structure. The etch stop layer is formed over the gate structure and the dielectric layer. The adhesion layer is formed between the etch stop layer and the gate structure, wherein the adhesion layer includes a main part and an extension part. The extension part is connected with the main part and is filled into a recess of the dielectric layer.

In accordance with alternative embodiments of the present disclosure, a step of a manufacturing method of a semiconductor device includes is as below. A gate structure is formed over a substrate. A dielectric layer is formed aside the gate structure. A recess is formed in the dielectric layer and in the gate structure. An adhesion layer is formed in the recess. The adhesion layer overlays a top surface of the gate structure and a first top surface of the dielectric layer. An etch stop layer is formed over the adhesion layer and a second top surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate structure over a substrate, wherein the gate structure comprises a gate electrode and a spacer;
a dielectric layer on a side of the gate structure, wherein the spacer is laterally between the gate electrode and the dielectric layer;
an adhesion layer overlaying a top surface of the gate electrode and a top surface of the spacer of the gate structure and laterally extending beyond an outer sidewall of the spacer to cover a first top surface of the dielectric layer, wherein the outer sidewall of the spacer is opposite to an inner sidewall of the spacer contacting the gate electrode; and an etch stop layer over the adhesion layer and in physical contact with a second top surface of the dielectric layer, wherein the adhesion layer comprises a portion located between the etch stop layer and the dielectric layer, and a sidewall of the portion of the adhesion layer is in physical contact with the dielectric layer.

2. The semiconductor device according to claim 1, wherein a shape of the adhesion layer comprises a T-shape, an inverted trapezoidal shape, a bowl-shape, a rectangular shape, or a combination thereof.

3. The semiconductor device according to claim 1, wherein a top surface of the adhesion layer is coplanar with the second top surface of the dielectric layer.

4. The semiconductor device according to claim 1, wherein a material of the adhesion layer is a high-k dielectric material, and the high-k dielectric material is a dielectric material with a dielectric constant greater than 4.

5. The semiconductor device according to claim 4, wherein the high-k dielectric material comprises a nitrogen-containing material, a metal nitride material, a metal oxide material, or a combination thereof.

6. The semiconductor device according to claim 1, wherein a material of the etch stop layer comprises silicon nitride, silicon oxynitride, silicon carbide, carbon-doped silicon nitride, or a combination thereof.

7. The semiconductor device according to claim 1, further comprising a first etch stop layer laterally between the spacer and the dielectric layer.

8. A semiconductor device, comprising:
a gate structure over a substrate, wherein the gate structure comprises a gate electrode and a spacer;
a dielectric layer on a side of the gate structure, wherein the spacer of the gate structure is laterally between the gate electrode and the dielectric layer;
an etch stop layer over the gate structure and the dielectric layer, wherein the etch stop layer is in physical contact with the dielectric layer; and
an adhesion layer between the gate structure and the etch stop layer, wherein the adhesion layer comprises:
a main part over the gate electrode of the gate structure; and
an extension part connected with the main part, wherein the extension part overlays the spacer of the gate structure, and laterally extends beyond an outer sidewall of the spacer and is located between the etch stop layer and the dielectric layer, and a sidewall of the extension part is in physical contact with the dielectric layer,
wherein the outer sidewall of the spacer is opposite to an inner sidewall of the spacer contacting the gate electrode.

9. The semiconductor device according to claim 8, wherein a profile of an interface between the adhesion layer and the dielectric layer comprises a step shape, a slope shape, an arc shape, or a combination thereof.

10. The semiconductor device according to claim 8, wherein a top surface area of the adhesion layer is larger than or equal to a bottom surface area of the adhesion layer.

11. A manufacturing method of a semiconductor device, comprising:
forming a gate structure over a substrate, wherein the gate structure comprises a gate electrode and a spacer;

forming a dielectric layer on a side of the gate structure, wherein the spacer is laterally between the gate electrode and the dielectric layer;

forming a recess in the dielectric layer and in the gate structure;

forming an adhesion layer in the recess, wherein the adhesion layer overlays a top surface of the gate electrode and a top surface of the spacer of the gate structure and laterally extends beyond an outer sidewall of the spacer to cover a first top surface of the dielectric layer, wherein the outer sidewall of the spacer is opposite to an inner sidewall of the spacer contacting the gate electrode; and forming an etch stop layer over the adhesion layer and a second top surface of the dielectric layer, wherein the etch stop layer is in physical contact with the second top surface of the dielectric layer, wherein the adhesion layer comprises a portion located between the etch stop layer and the dielectric layer, and a sidewall of the portion of the adhesion layer is in physical contact with the dielectric layer.

12. The manufacturing method of the semiconductor device according to claim 11, wherein the step of forming the adhesion layer comprises:
forming an adhesion material layer over the dielectric layer and in the recess; and
removing a portion of the adhesion material layer such that the second top surface of the dielectric layer is exposed.

13. The manufacturing method of the semiconductor device according to claim 11, wherein a method of removing the portion of the adhesion material layer comprises a chemical mechanical polishing (CMP) process, an etching back process or a combination thereof.

14. The manufacturing method of the semiconductor device according to claim 11, wherein the step of foil ling the recess comprises:
forming a patterned mask layer over the dielectric layer, wherein the patterned mask layer has an opening, the opening exposes the gate structure and a portion of the dielectric layer; and
performing an etching process to remove a portion of the gate structure and a portion of the dielectric layer.

15. The manufacturing method of the semiconductor device according to claim 14, wherein in the etching process, a removing rate of the portion of the dielectric layer is equal to a removing rate of the portion of the gate structure.

16. The manufacturing method of the semiconductor device according to claim 14, wherein in the etching process, a removing rate of the portion of the dielectric layer is not equal to a removing rate of the portion of the gate structure.

17. The manufacturing method of the semiconductor device according to claim 11, wherein a shape of the adhesion layer comprises a T-shape, an inverted trapezoidal shape, a bowl-shape, a rectangular shape, or a combination thereof.

18. The manufacturing method of the semiconductor device according to claim 11, wherein a material of the adhesion layer and a material of the dielectric layer are different.

19. The manufacturing method of the semiconductor device according to claim 11, wherein a material of the adhesion layer comprises a high-k dielectric material, the high-k dielectric material comprises a nitrogen-containing material, a metal nitride material, a metal material, or a combination thereof.

20. The manufacturing method of the semiconductor device according to claim 11, further comprising forming a contact over the gate substrate, wherein the contact penetrates the etch stop layer and the adhesion layer to electrically connect with the gate structure.

* * * * *